United States Patent
Bertele et al.

(10) Patent No.: US 7,158,359 B2
(45) Date of Patent: Jan. 2, 2007

(54) CIRCUIT CONFIGURATION HAVING A SEMICONDUCTOR SWITCH AND A PROTECTION CIRCUIT

(75) Inventors: Martin Bertele, Martinsried (DE); Robert Oyrer, Villach (AT); Rainald Sander, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/252,322

(22) Filed: Sep. 23, 2002

(65) Prior Publication Data

US 2003/0058593 A1  Mar. 27, 2003

(30) Foreign Application Priority Data

Sep. 21, 2001 (DE) ................. 101 46 581

(51) Int. Cl.
*H02H 3/08* (2006.01)
(52) U.S. Cl. .................... 361/93.9; 361/93.7
(58) Field of Classification Search .......... 361/54, 361/57, 79, 91.1, 91.2, 91.3, 91.4, 91.5, 91, 361/103, 93.7–93.9, 23–28, 94
See application file for complete search history.

(56) References Cited

U.S. PATENT DOCUMENTS

| | | | |
|---|---|---|---|
| 4,634,936 A * | 1/1987 | Gentry et al. ................ 315/307 |
| 4,809,122 A * | 2/1989 | Fitzner ............................ 361/18 |
| 5,422,593 A * | 6/1995 | Fujihira ........................ 327/561 |
| 5,467,242 A * | 11/1995 | Kiraly ............................ 361/94 |
| 5,537,064 A * | 7/1996 | Pease et al. .................. 326/124 |
| 5,638,021 A * | 6/1997 | Kaifler et al. ................ 327/513 |
| 5,710,508 A * | 1/1998 | Watanabe .................... 323/284 |
| 5,724,218 A * | 3/1998 | Tihanyi ........................ 361/79 |
| 5,737,169 A * | 4/1998 | Sellers .......................... 361/98 |
| 5,747,975 A * | 5/1998 | Colandrea et al. .......... 323/276 |
| 5,796,278 A * | 8/1998 | Osborn et al. .............. 327/108 |
| 6,205,010 B1 * | 3/2001 | Ohsaka et al. ............. 361/103 |
| 6,404,608 B1 * | 6/2002 | Pryor et al. ................. 361/93.1 |
| 6,452,766 B1 * | 9/2002 | Carper ......................... 361/18 |
| 6,624,994 B1 * | 9/2003 | Schmoock et al. ......... 361/93.1 |

FOREIGN PATENT DOCUMENTS

DE  42 20 021 A1  12/1993
EP  0 766 395 A2  4/1997

* cited by examiner

*Primary Examiner*—Brian Sircus
*Assistant Examiner*—Danny Nguyen
(74) *Attorney, Agent, or Firm*—Laurence A. Greenberg; Werner H. Stemer; Ralph E. Locher

(57) ABSTRACT

A circuit configuration has a first semiconductor switch and a first protection circuit. The protection circuit has a second semiconductor switch whose load path is connected between a control terminal and a load path terminal of the first semiconductor switch. The second semiconductor switch is switched on by a comparator circuit, in each case for a predefined time period, in dependence on a comparison between a load path voltage and a reference voltage, or between a load path current and a reference current.

9 Claims, 4 Drawing Sheets

CIRCUIT CONFIGURATION HAVING A SEMICONDUCTOR SWITCH AND A PROTECTION CIRCUIT

BACKGROUND OF THE INVENTION

Field of the Invention

The present invention relates to a circuit configuration with a semiconductor switch and a protection circuit, in particular a protection circuit for protecting the semiconductor switch on occurrence of a short-circuit on the load side.

In order to switch loads it is well known to connect the load to a supply voltage, in series with a semiconductor switch, in particular a MOSFET (Metal Oxide Semiconductor Field-Effect Transistor), and switch the semiconductor switch on or off. In order to protect the MOSFET against damage in the event of a short circuit of the load it is known to provide protection circuits in such MOSFETs which are used as switches. What is referred to as short circuit II, which occurs when a MOSFET is switched on, is particularly critical here. The MOSFET is subjected here under certain circumstances to a high load current which can lead to its overheating and destruction.

In a prior art protection circuit for protecting the MOSFET in the event of a short circuit, or to limit the load current, a transistor is connected in series with a current source between the gate terminal of the MOSFET and its source terminal, or a reference potential, the transistor being actuated by a current measuring arrangement which senses the load current through the MOSFET. When a predefined current level for the load current is exceeded, the gate of the transistor is discharged with a defined current which is predefined by the current source, in order to reduce the power of the transistor and limit the load current.

It is thereby a problem that, owing to the discharge current predefined by the current source, the discharging of the gate terminal takes place, under certain circumstances, too slowly to protect the MOSFET against the load current which rises rapidly when there is a short circuit, with the result that the MOSFET is subjected to a high current for an excessively long time period.

SUMMARY OF THE INVENTION

It is accordingly an object of the invention to provide a circuit configuration with a semiconductor switch and a protective circuit which overcomes the above-mentioned disadvantages of the heretofore-known devices and methods of this general type and wherein the protection circuit quickly limits the load current when there is a load short circuit.

With the foregoing and other objects in view there is provided, in accordance with the invention, a circuit configuration, comprising:

a first semiconductor switch with a control terminal and first and second load path terminals; and a protection circuit having a second semiconductor switch with a control terminal and a load path connected between the control terminal of the first semiconductor switch and a terminal for the first potential, and having a drive circuit connected to the second semiconductor switch, the drive circuit being configured to compare a load path voltage across the first semiconductor switch with a first reference voltage or a load current through the first semiconductor switch with a reference current, and to switch on the second semiconductor switch, in each case for a predefined time period, in dependence on a comparison result.

In other words, the circuit configuration according to the invention has a first semiconductor switch with a control terminal and a first and second load path terminal, and a first protection circuit. The first protection circuit comprises a second semiconductor switch with a control terminal and a load path which is connected between the control terminal of the first semiconductor switch and a terminal for a first reference potential, and a drive circuit for the second semiconductor switch. The drive circuit compares a load path voltage of the first semiconductor switch with a first reference voltage or a load current of the first semiconductor switch with a reference current and, as a function of the comparison result, switches on the semiconductor switch, in each case for a predefined time period.

In the circuit configuration according to the invention, the power of the first semiconductor switch, which is embodied in particular as a MOSFET and is used to switch a load to a supply voltage, is reduced in that its gate capacitor is discharged by the second semiconductor switch during a predefined time period if a voltage which is present over the load path between the first and second load path terminals of the first semiconductor switch exceeds the value of the first reference voltage, which indicates a short circuit of the load. The discharging of the gate capacitor via the second semiconductor switch is carried out here essentially without current limiting. The discharge current which flows via the second semiconductor switch is preferably limited here only by bulk resistances which are unavoidably present.

The protection circuit according to the invention is used in particular in conjunction with a conventional protection circuit which discharges the gate capacitor of the MOSFET with a defined current when an excessively high load current occurs. The protection circuit according to the invention brings about here a pre-discharge of the gate capacitor in order to reduce the load current quickly to a value which at least does not lead to overheating of the MOSFET in the short term. The further current limiting is then performed by the other protection circuit.

In one embodiment of the invention, the protection circuit has a comparator configuration for comparing the load path voltage of the MOSFET with a first reference voltage. The comparator configuration is embodied in particular as a comparator, one terminal of which is connected to one of the load path terminals of the MOSFET via a reference voltage source, and the other terminal of which is connected to the other load path terminal of the MOSFET. One output of the comparator is connected here to a control terminal of the second semiconductor switch, in particular via a high-pass filter. If the load path voltage exceeds the first reference voltage, a jump signal, which changes from a lower level to an upper level or from a lower level to an upper level is present at the output of the comparator. The high-pass filter generates a drive pulse for the second semiconductor switch from this jump signal, in order to switch on this semiconductor switch.

In accordance with an added feature of the invention, the second semiconductor switch is preferably embodied as a MOS transistor. In this case, the gate terminal to which the pulse signal is fed is preferably connected there via an ohmic resistor to its source terminal or a low potential in order to discharge the gate capacitor of the transistor again after charging by the pulse of the filter, and thus ensures that the transistor conducts only for a predefined time period. This time period is dependent, inter alia, on the gate capacitor of the transistor which serves as a second semiconductor switch, and the resistance value of the ohmic transistor.

The second semiconductor switch is connected between the gate terminal and the source terminal of the MOSFET which serves as a first semiconductor switch, or between the gate terminal and any other terminal which is at a potential which is fit for discharging the gate capacitor. In one embodiment of the invention, a voltage source is connected in series with the second semiconductor switch in order to limit the discharging of the gate capacitor in the downward direction. The discharging of the gate capacitor by the second semiconductor switch ends if the voltage between the gate terminal and the source terminal has dropped to the value of the voltage made available by the voltage source.

Other features which are considered as characteristic for the invention are set forth in the appended claims.

Although the invention is illustrated and described herein as embodied in a circuit configuration having a semiconductor switch and a protection circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
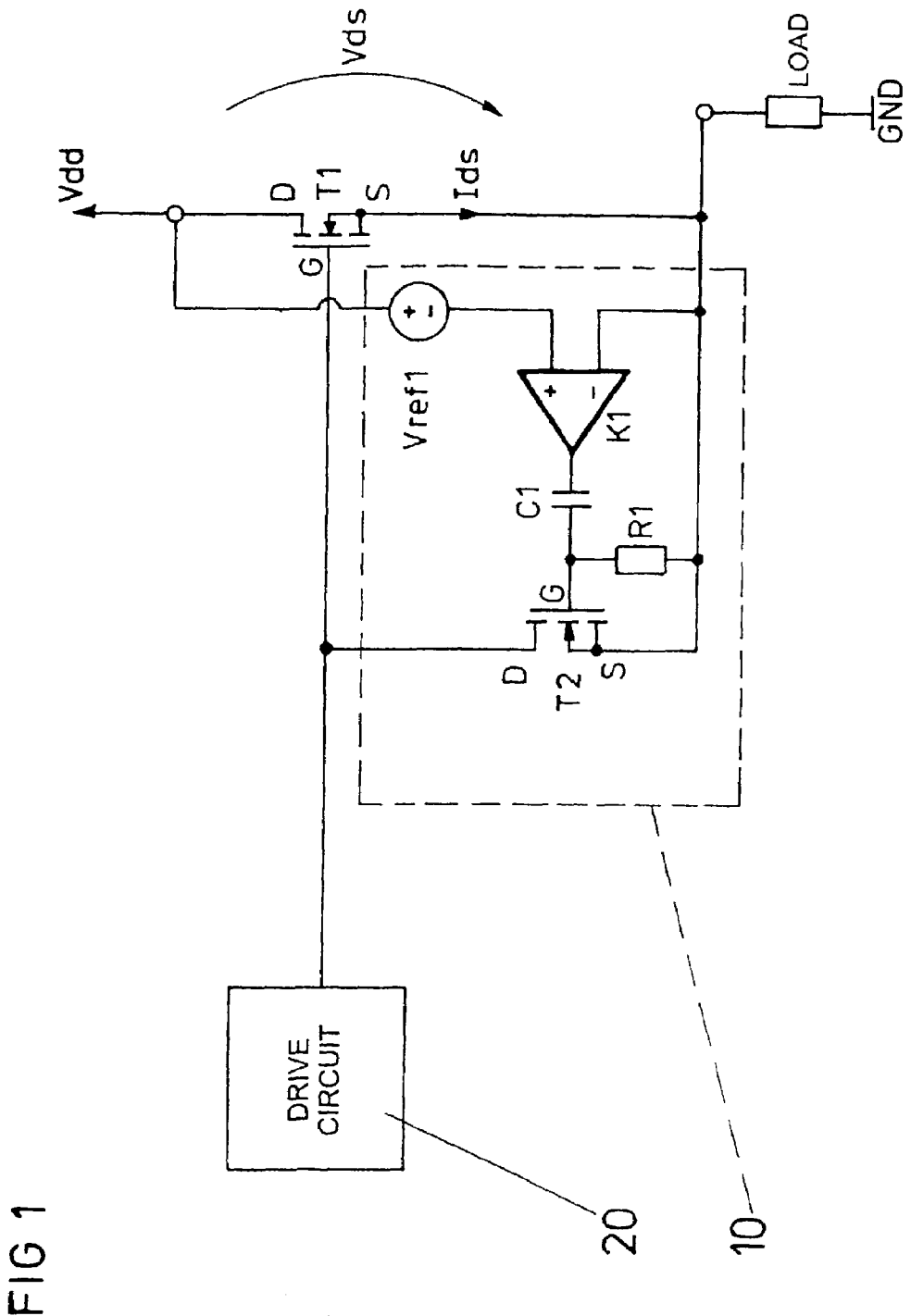
FIG. 1 is a schematic diagram of a first exemplary embodiment of a circuit configuration according to the invention with a first semiconductor switch and a first protection circuit.

Referring now to the figures of the drawing in detail and first, particularly, to FIG. 1 thereof, there is shown FIG. 1 shows a first exemplary embodiment of a circuit configuration according to the invention with a first semiconductor switch T1 and a protection circuit 10. The first semiconductor switch T1 is embodied in the example as an n-type channel MOSFET which has a gate terminal G forming its control terminal, and a drain terminal D and a source terminal S forming its load path terminals. The transistor T1 is used to drive a load. In order to illustrate this function, the drain-source path D-S of the transistor T1 is connected in FIG. 1 in series with a load between terminals for the supply potential Vdd and reference potential GND, in particular ground potential. In order to drive the transistor T1, a drive circuit 20 is provided which is connected to the gate terminal G of the transistor T1 in order to charge the gate capacitance (not illustrated in more detail) which is inherently present in the MOS transistor T1, so as to switch the transistor T1 on, and in order to discharge the capacitor again so as to switch off the transistor T1. The drive circuit 20 preferably has a current source (not illustrated in more detail) in order to charge the gate capacitors so as to switch on the transistor with a defined current and in this way limit the steepness of the switching edges during the switching operations.

According to the invention, a protection circuit 10 is provided which limits a load current Ids through the transistor T1 if there is a short circuit of the load while the transistor T1 is switched on. The protection circuit 10 has a second semiconductor switch T2 which in the exemplary embodiment is also embodied as an n-type channel MOSFET, and whose drain-source path D-S is connected between the gate terminal G and the source terminal S of the transistor T1.

The second transistor T2 is driven by a comparator circuit which compares the load path voltage or the drain-source voltage Vds of the transistor T1 with a first reference voltage Vref1, and which switches on the second transistor T2 as a function of the comparison result. The comparator configuration has a comparator K1 whose positive input is connected via a reference voltage source Vref1 to the drain terminal D of the transistor T1 and whose negative input is connected to the source terminal S of the transistor T1. If the drain-source voltage Vds exceeds the value of the reference voltage Vref1, in the illustrated exemplary embodiment an output signal of the comparator K1 changes from a lower voltage level to an upper voltage level.

Between the output of the comparator K1 and the gate terminal G of the second transistor T2 a high-pass filter is connected which is embodied in FIG. 1 as a capacitor C1 and which generates, from the jump-shaped output signal of the comparator K1 which arises when the drain-source voltage Vds exceeds the first reference voltage Vref1, a pulse-shaped signal for driving the second transistor T2. The pulse-shaped signal is produced by filtering the low-frequency components from the jump-shaped output signal of the comparator K1 through the capacitor C1. The pulse-shaped signal which is generated by the capacitor C1 from the jump-shaped output signal of the comparator K1 switches on the transistor T2 in order to discharge the gate capacitor of the transistor T1 to the source potential. The gate terminal G of the second transistor T2 is connected via a resistor R1 to its source terminal, the gate capacitor (not illustrated in more detail) of the second transistor T2 is charged by the pulse-shaped drive signal and then discharged again via the resistor R1. The second resistor T2 switches off as soon as its gate-source voltage has been discharged by the resistor R1 to a value below the threshold voltage of the transistor T2. The time period for which the second transistor T2 remains switched on after the driving by the pulse-shaped signal is dependent, inter alia, on the gate capacitor of the transistor T2 and the resistor R1, the magnitude of the resistance value of the ohmic resistor R1 being directly proportional to the length of time for which the second transistor T2 remains switched on.

The protection circuit 10 according to the invention discharges the gate capacitor of the first transistor T1 via the second transistor T2 for a predetermined time period if the drain-source voltage Vds exceeds the value of the first reference voltage Vref1 so as to reduce the power of the transistor T1 and limit its load current Ids and thus protect the transistor T1 against overheating. The reference voltage Vref1 is selected here to have such a magnitude that it is assumed that there is a short circuit of the load if the drain-source voltage exceeds the first reference voltage Vref1.

In the illustrated exemplary embodiment, the second transistor T2 discharges the gate capacitor of the transistor T1 to source potential of the first transistor T1. Of course, the transistor T2 can also be connected between the gate terminal between the first transistor T1 and any other terminal at which a sufficiently low potential is applied in order to discharge the gate capacitor of the transistor T1 when the transistor T2 is switched on.

The discharge current of the transistor T1 via the transistor T2 is limited only by the bulk resistances which are inevitably present, and the switch-on resistance of the transistor T2, as long as the transistor T2 is switched on.

Figure 2:
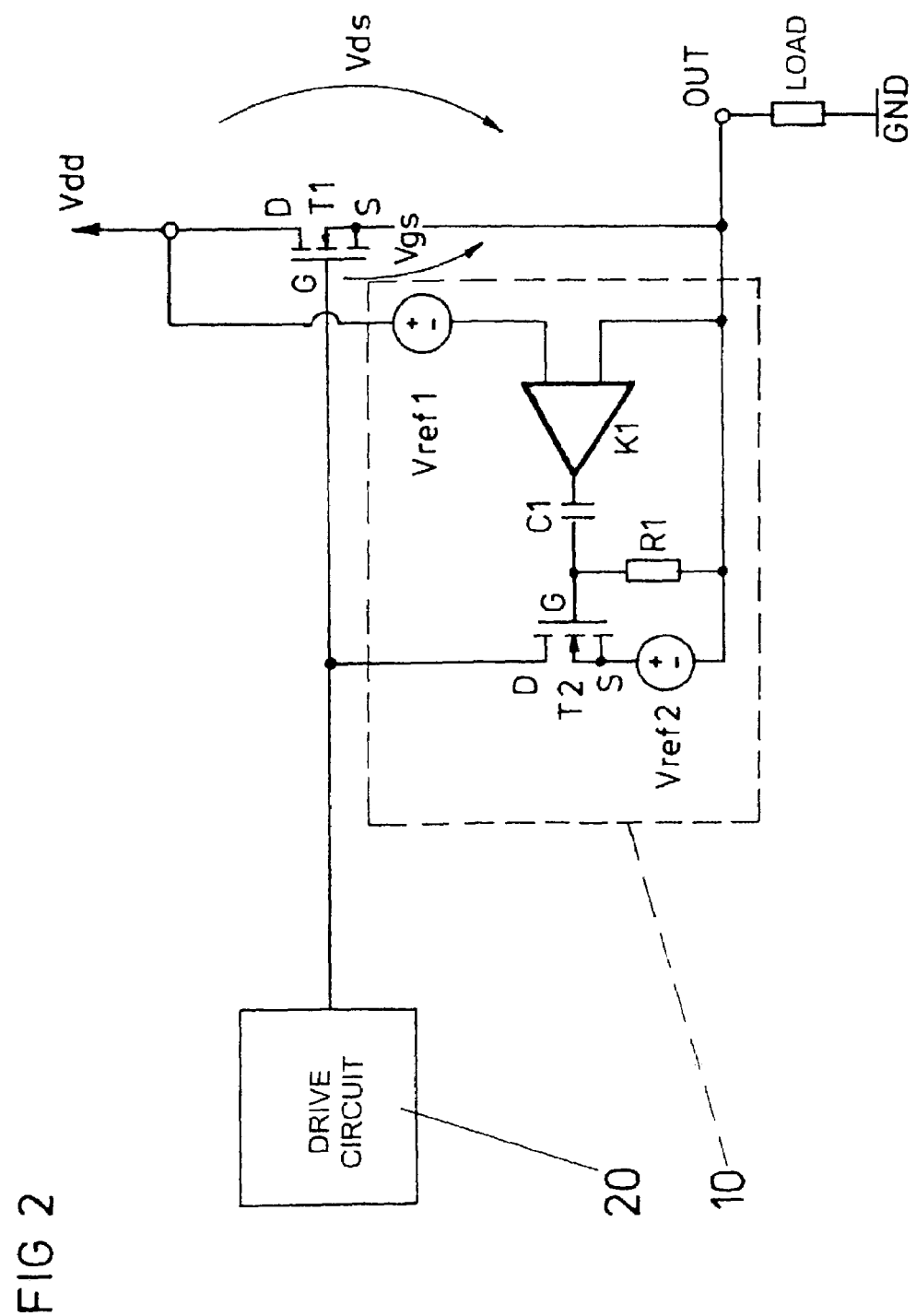
FIG. 2 is a schematic diagram of a second exemplary embodiment of a circuit configuration according to the invention with a first semiconductor switch and a first protection circuit.

FIG. 2 shows a further exemplary embodiment of a circuit configuration according to the invention with a transistor T1 which serves to drive a load, and a protection circuit 10. The protection circuit according to FIG. 2 differs from that according to FIG. 1 in that a second reference voltage source Vref2 is connected in series with the drain-source path D-S of the second transistor T2, between the gate terminal G and the source terminal S of the first transistor T1. When the transistor T2 is switched on, the gate capacitor of the transistor T1 is discharged, as a result of which its gate-source voltage Ugs drops and the power of the transistor T1 is reduced. The reference voltage source Vref2 which is connected in series with the second transistor T2 limits, in the downward direction, the drop in the gate-source voltage Ugs brought about by the protection circuit 10. In the exemplary embodiment according to FIG. 2, the gate-source voltage Ugs cannot drop below the value of the second reference voltage Vref2 when the transistor T2 is switched on.

Figure 3:
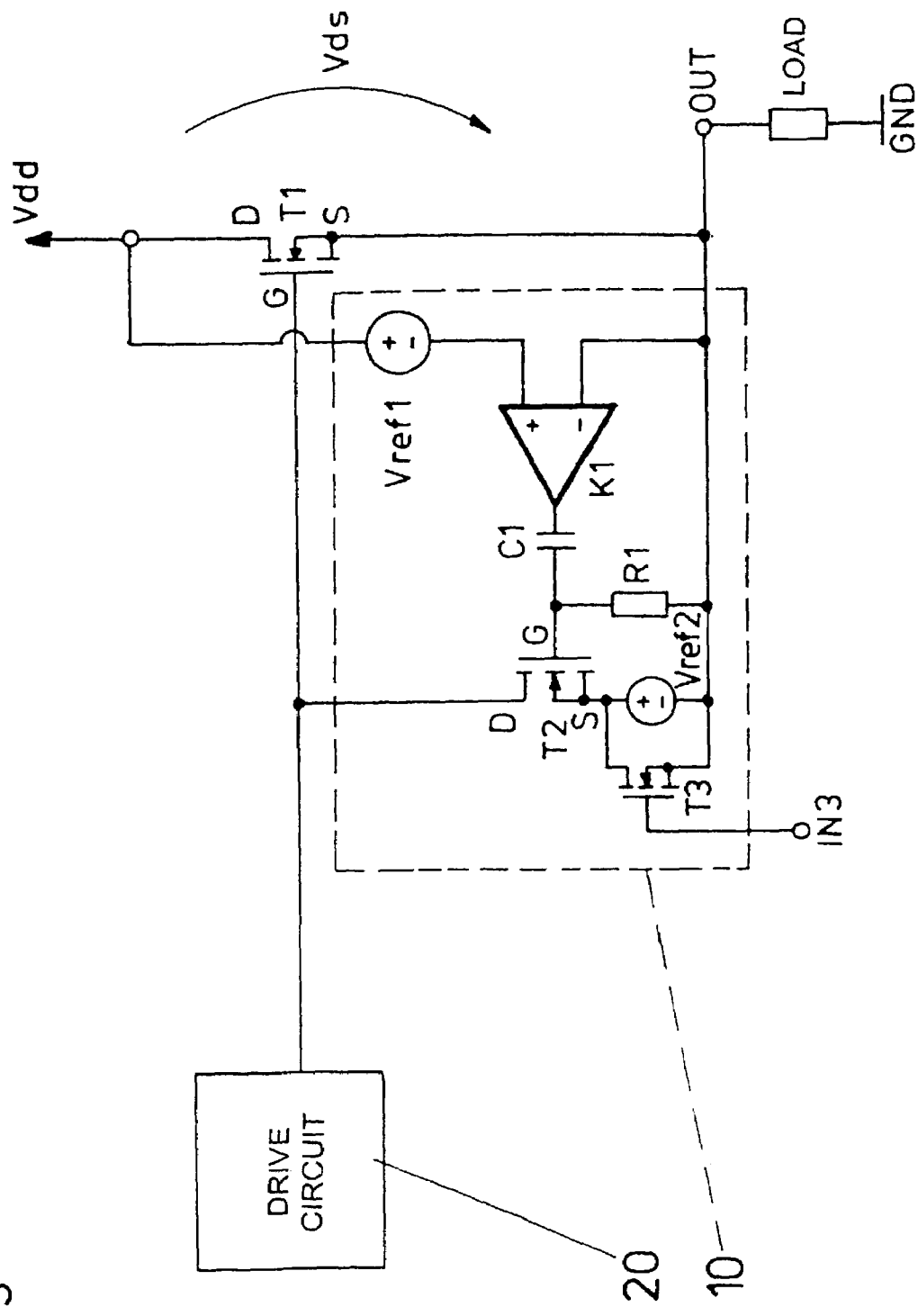
FIG. 3 is a schematic diagram of a third exemplary embodiment of a circuit configuration according to the invention with a first semiconductor switch and a first protection circuit.

FIG. 3 shows a further exemplary embodiment of a circuit arrange-ment according to the invention which differs from that illustrated in FIG. 2 in that the second reference voltage source Vref2 is bypassed by a switch which is embodied as a transistor T3, it being possible to drive the transistor via a drive input IN3. In the event of an exemplary embodiment according to FIG. 3, the limiting, in the downward direction, of the gate-source voltage Ugs which is brought about by the reference voltage source Vref2 is prevented if the transistor T3 is switched on via the input IN3.

Figure 4:
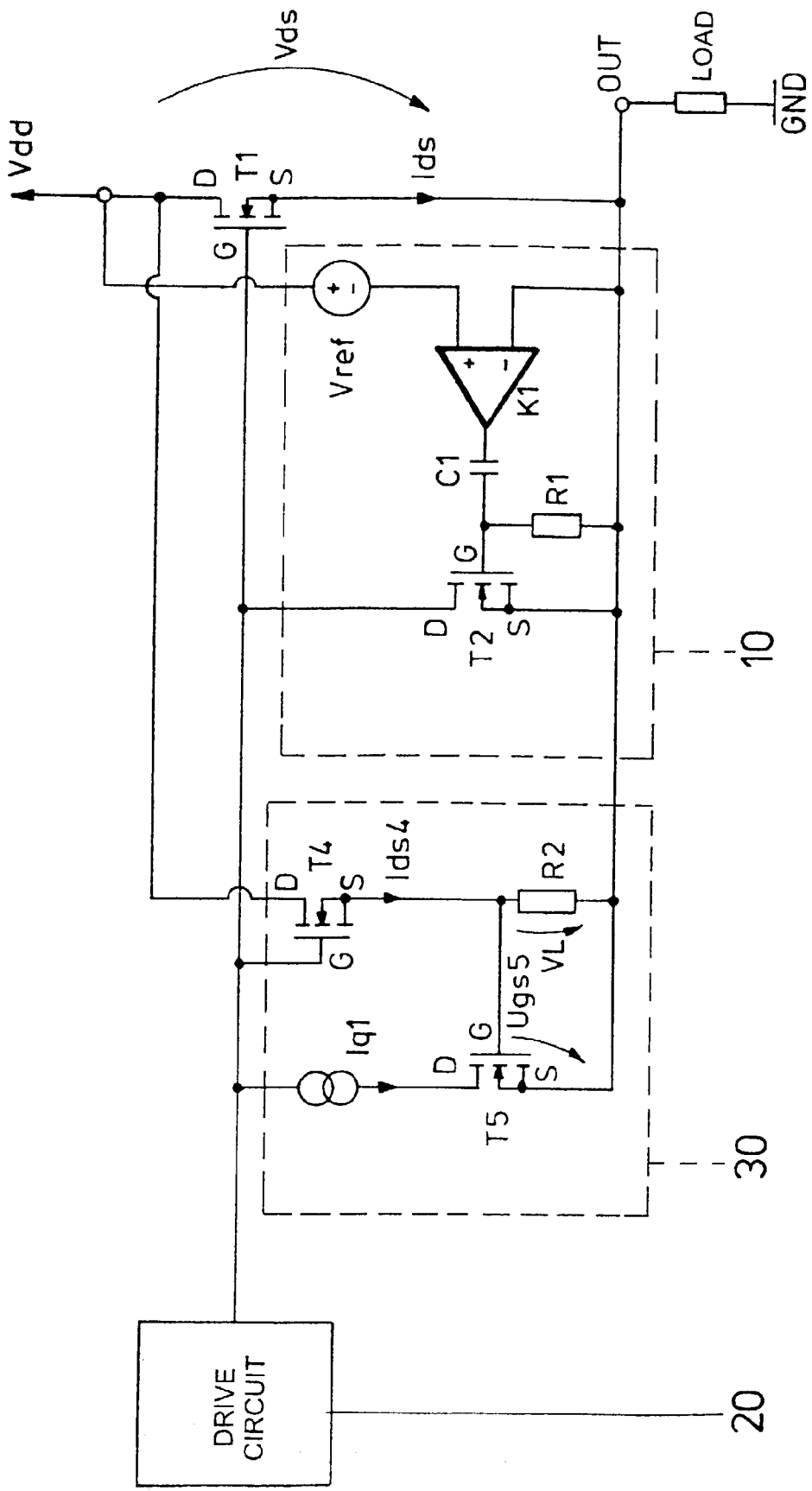
FIG. 4 is a schematic diagram of an exemplary embodiment of a circuit configuration according to the invention with a first semiconductor switch, a first protection circuit and a second protection circuit.

The protection circuit according to the invention in accordance with FIGS. 1 to 3 is used in particular in conjunction with a further protection circuit 30 as illustrated in FIG. 4. This protection circuit has a semiconductor switch T5 which is embodied as a transistor and which is connected in series with a current source Iq1, between the gate terminal G and the source terminal S of the first transistor T1 which is used to drive the load. The transistor T5 is driven by means of a current measuring arrangement which senses the load current Ids through the first transistor T1, the gate capacitor of the transistor T1 being discharged, when the transistor T1 is switched on, with a defined current supplied by the current source Iq1.

The current measuring arrangement has a measuring transistor T4 which is of the same conduction type as the first transistor T1, and whose gate terminal G is connected to the gate terminal of the first transistor T1, and whose drain terminal D is connected to the drain terminal of the first transistor T1. The source terminal S of the measuring transistor T4 is connected via a resistor R2 to the source terminal S of the first transistor T1. A load current Ids4 of the measuring transistor T4 has a relationship with the drain-source voltage Vds of the first transistor T4, and the load current Ids of the first transistor T1, the load current Ids4 of the measuring transistor T4 which is used as a measuring current being higher the higher the drain-source voltage Vds or the load current Ids or the first transistor T1. The measuring current Ids4 brings about a voltage drop V2 as a resistor R2 which is connected downstream of the transistor T4, which voltage drop V2 corresponds in the example to the gate-source voltage Ugs5 of the transistor T5, the transistor T5 being switched on if the voltage drop V2 which is brought about by the measuring current Ids4 at the resistor R2 exceeds the threshold voltage of the transistor T5.

The circuit 30 forms a regulating circuit which limits the load current Ids of the transistor T1 by reducing the power of the transistor T1 as a function of the load current Ids. The speed at which the circuit 30 discharges the gate capacitor of the transistor T1 is limited here by the current supplied by the current source Iq1 which, when there is a short circuit of the load and the transistor T1 is switched on, can lead to the transistor T1 being subjected to a very large load current Ids for a relatively long time period until the circuit configuration 30 has discharged the gate capacitor of the transistor T1 sufficiently. For this reason, in the circuit configuration according to FIG. 4, the protection circuit 10 is provided which, when there is a short circuit of the load and the transistor T1 is switched on, quickly (pre)discharges the gate capacitor for a temporally limited time period in order to reduce the load current Ids within a short time so as to prevent damage to the transistor T1. A further reduction in the power of the transistor T1 is then performed by the circuit configuration 30.

The series circuit with the transistor T5 and the current source Iq1 can, of course, also be connected between the gate terminal G of the transistor T1 and a terminal for a potential which is sufficiently low to discharge the gate capacitor G when the transistor T5 is switched on.

We claim:

1. A circuit configuration, comprising:
a terminal for a first potential;
a first semiconductor switch with a control terminal and first and second load path terminals;
a protection circuit having a second semiconductor switch with a control terminal and a load path connected between said control terminal of said first semiconductor switch and said terminal for the first potential, and having a drive circuit connected to said second semiconductor switch, said drive circuit being configured to compare a load path voltage across said first semiconductor switch with a first reference voltage or a load current through said first semiconductor switch with a reference current, and to switch on said second semiconductor switch, in each case for a preset and non-varying time period set in advance, in dependence on a comparison result;
a reference voltage source connected in series with said second semiconductor switch, between said control terminal of said first semiconductor switch and said terminal for the first potential; and
a further protection circuit for detecting the load current through said first semiconductor switch element and regulating said first semiconductor switch element in dependence on the load current.

2. The circuit configuration according to claim 1, wherein said drive circuit includes a comparator configuration and a filter connected between said comparator configuration and said control terminal of said second semiconductor switch.

3. The circuit configuration according to claim 2, wherein said comparator configuration includes a comparator having a first input terminal connected to said first load path terminal of said first semiconductor switch via a further reference voltage source and a second input terminal connected to said second load path terminal of said first semiconductor switch.

4. The circuit configuration according to claim 2, wherein said comparator configuration has an output, and said filter has a capacitor connected between said output of said comparator configuration and said control terminal of said second semiconductor switch.

5. The circuit configuration according to claim 1, which comprises a resistor connected between said control terminal and a load path terminal of said second semiconductor switch.

6. The circuit configuration according to claim 1, which comprises a bypass switch connected to selectively bypass said reference voltage source.

7. The circuit configuration according to claim 1, wherein said terminal for the first potential forms one of said load path terminals of said first semiconductor switch.

8. The circuit configuration according to claim 1, wherein said drive circuit includes a comparator configuration and a high-pass filter connected between said comparator configuration and said control terminal of said second semiconductor switch.

9. A circuit configuration, comprising:
a terminal for a first potential;
a first semiconductor switch with a control terminal and first and second load path terminals; and a protection circuit having a second semiconductor switch with a control terminal and a load path connected between said control terminal of said first semiconductor switch and said terminal for the first potential, and having a drive circuit connected to said second semiconductor switch, said drive circuit being configured to compare a load path voltage across said first semiconductor switch with a first reference voltage or a load current through said first semiconductor switch with a reference current, and to switch on said second semiconductor switch, in each case for a preset and non-varying time period set in advance, in dependence on a comparison result said protection circuit being a first protection circuit and including a second protection circuit having a current measuring configuration for sensing a load current of said first semiconductor switch and a series circuit of a third semiconductor switch and a current source between said control terminal of said first semiconductor switch and said terminal for the first potential, and said third semiconductor switching element being actuated by said current measuring configuration.

* * * * *